United States Patent [19]

Nakano et al.

[11] Patent Number: 5,481,551
[45] Date of Patent: Jan. 2, 1996

[54] IC ELEMENT TESTING DEVICE

[75] Inventors: Rikizo Nakano; Noriyuki Matsui, both of Kawasaki, Japan

[73] Assignee: Fujitsu Limited, Kawasaki, Japan

[21] Appl. No.: 214,309

[22] Filed: Mar. 17, 1994

[30] Foreign Application Priority Data

Apr. 27, 1993 [JP] Japan ................. 5-099962

[51] Int. Cl.⁶ .................................. G06F 11/14
[52] U.S. Cl. .................. 371/27; 371/21.1; 371/21.4; 324/705; 324/73.1; 365/201
[58] Field of Search ............... 371/27, 21.1, 21.4; 365/201, 189.09; 324/751, 73 R, 765, 73.1; 364/571.01, 571.05, 580

[56] References Cited

U.S. PATENT DOCUMENTS

| | | | |
|---|---|---|---|
| 4,839,865 | 6/1989 | Sato et al. | 365/201 |
| 5,051,995 | 9/1991 | Tobita | 371/21.1 |
| 5,155,701 | 10/1992 | Komori et al. | 365/201 |
| 5,157,629 | 10/1992 | Sato et al. | 365/201 |
| 5,187,685 | 2/1993 | Sato et al. | 365/189.09 |
| 5,283,762 | 2/1994 | Fujishima | 365/189.09 |
| 5,300,880 | 4/1994 | Okubo et al. | 324/751 |

*Primary Examiner*—Emanuel T. Voeltz
*Assistant Examiner*—Kyle J. Choi
*Attorney, Agent, or Firm*—Staas & Halsey

[57] ABSTRACT

An IC element testing device includes a test pattern generating unit for generating test patterns, a power supply unit for generating a power supply voltage, a superposed voltage generating unit for generating a superposed voltage, and a superposing unit for superposing the superposed voltage on the power supply voltage and for outputting a superposed power supply voltage to an IC element to which the test patterns generated by the test pattern generating unit are applied.

12 Claims, 8 Drawing Sheets

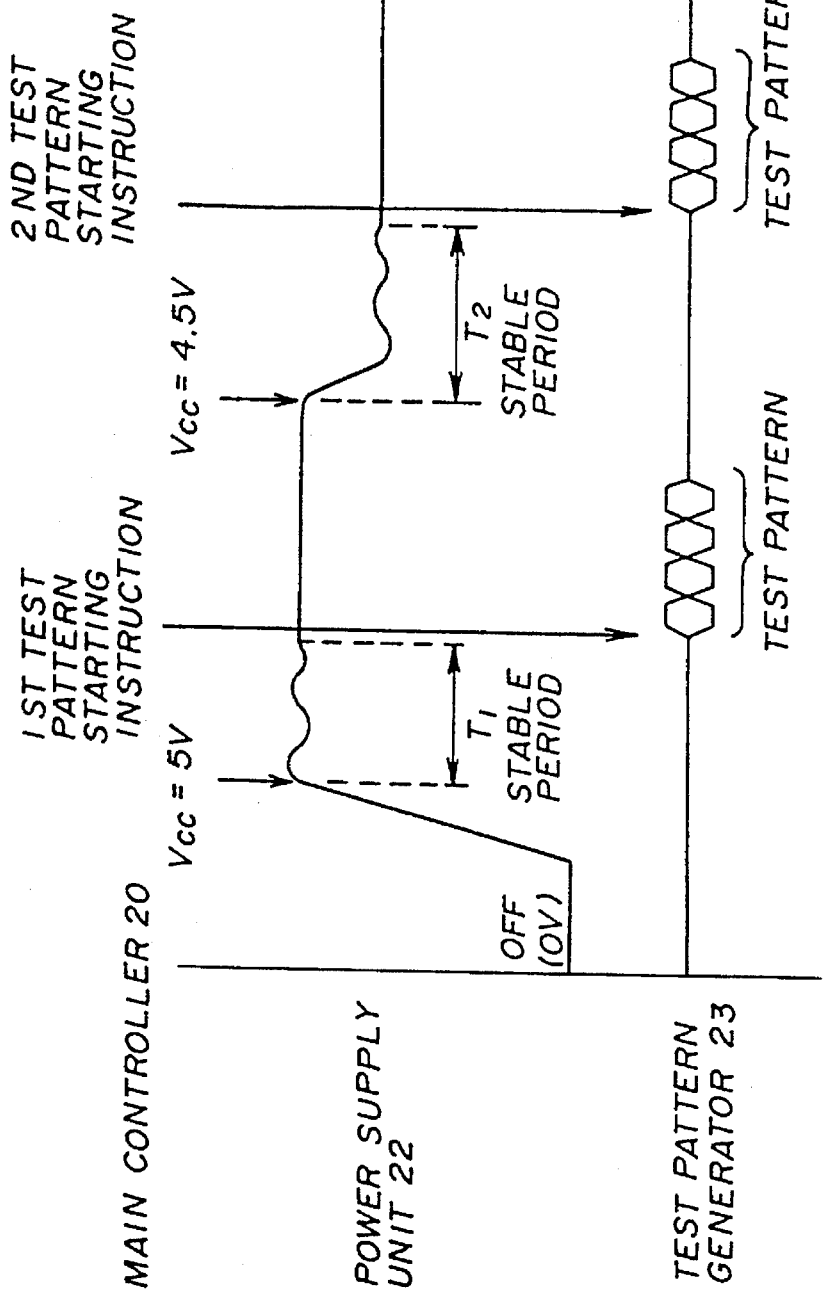

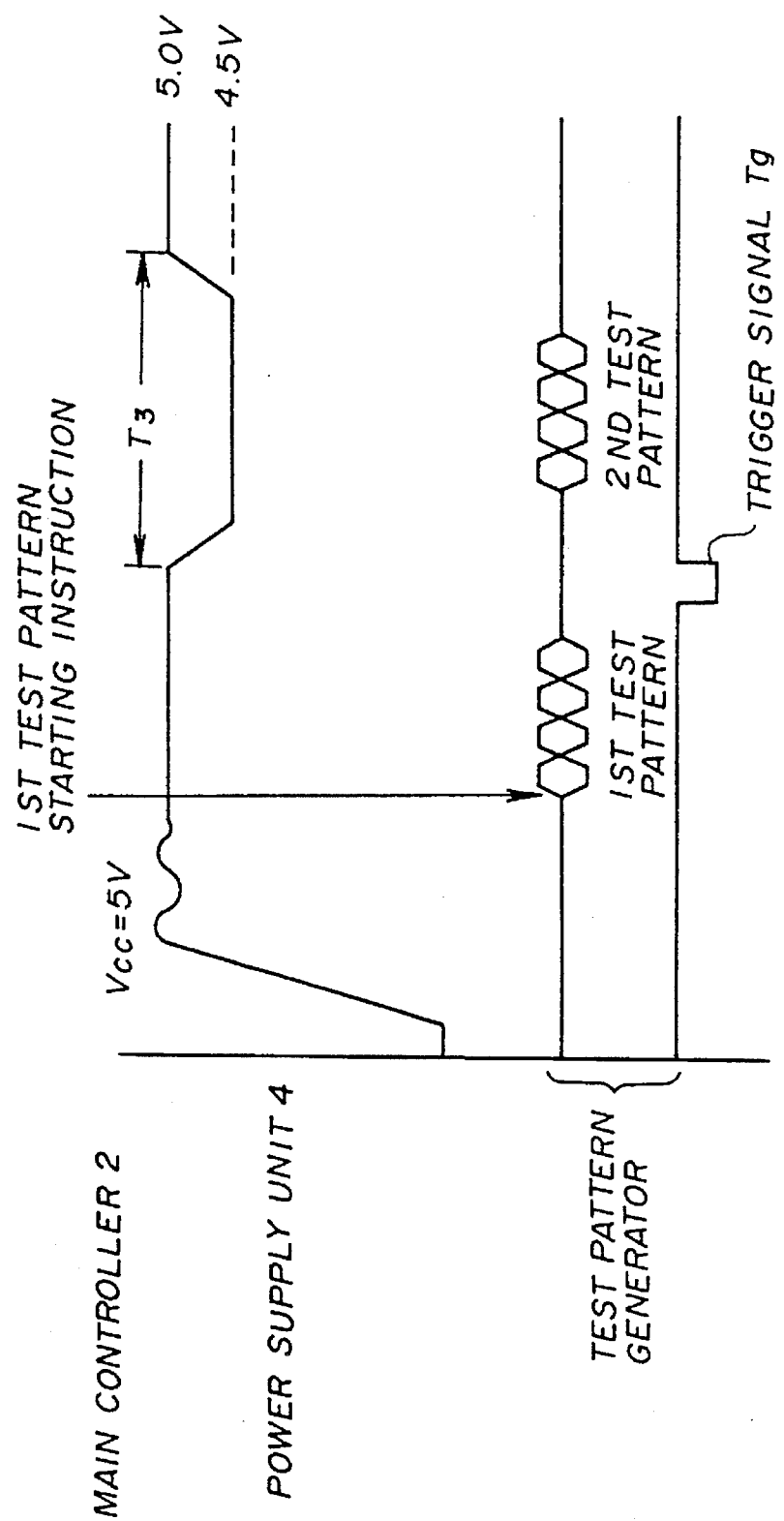

5,481,551

IC ELEMENT TESTING DEVICE

BACKGROUND OF THE INVENTION

Field of the Invention

The present invention generally relates to IC (Integrated Circuit) element testing devices and, more particularly to a testing device which performs variable voltage control for a bump test.

A bump test is one of several tests for IC elements, and is intended to determine how IC elements, such as memory devices, are influenced by variations in the power supply voltage. A conventional testing device, such as a memory tester, has a configuration as shown in FIG. 1A in order to perform the bump test. The testing device shown in FIG. 1A is made up of a main controller 20, a power supply voltage controller 21, a power supply unit 22, and a test pattern generator 23. An IC element 1 to be tested is supplied with a voltage generated by the power supply unit 22, and is supplied with a test pattern generated by the test pattern generator 23.

The operation of the testing device shown in FIG. 1A will be described with reference to FIG. 1B. In order to set the voltage Vcc, which is to be applied to the IC element 1 by the power supply unit 22, to a predetermined level equal to, for example, 5V at the time of testing the IC element 1, the main controller 20 outputs a control instruction, causing the voltage Vcc to be equal to 5V, to the power supply voltage controller 21. In response to the control instruction, the power supply voltage controller 21 turns ON the power supply unit 22. The voltage generated by the power supply unit 22 and applied to the IC element 1 settles at 5V after a stabilizing period, or which is time T1, necessary for the voltage to become stable. Then, the main controller 20 outputs a first test pattern starting instruction to the test pattern generator 23. The test pattern generator 23 generates a first test pattern to be supplied to the IC element 1 to be tested, in a normal state in which the voltage 5V is applied to the IC element 1.

When the bump test is performed, the main controller 20 outputs a control instruction, causing the voltage Vcc to be equal to, for example, 4.5V, to the power supply voltage controller 21. In response to the above control instruction, the power supply voltage controller 21 controls the power supply unit 22 so that the voltage 4.5V is applied to the IC element 1 to be tested. After a stabilizing period, or time T2 necessary for the applied voltage to become stable, the voltage settles at the voltage 4.5V. Then, the main controller 20 outputs a second test pattern starting instruction to the test pattern generator 23. The test pattern generator 23 outputs a second test pattern to the IC element 1 to be tested in a state in which the applied voltage is varied (in the above case, the applied voltage is decreased to 4.5V). The first and second test patterns may be identical to or different from each other.

As described above, conventionally, the output voltage, itself, of the power supply unit 22 is varied by the control instruction generated by the main controller 20. Hence, it takes a long time for the output voltage to settle and the response is not good. In other words, the test pattern cannot be output to the IC element 1 until the output voltage generated by power supply unit 22 becomes stable. A fault will be recovered within the above time, T1 or T2, necessary for the output voltage to settle. In this case, the bump test is no longer effective. For example, a transistor for charging a bit line is temporarily turned OFF in response to a decrease in the power supply voltage, and is returned to the ON state when a predetermined time has passed after the transistor is turned OFF. The bump test cannot detect such a fault.

SUMMARY OF THE INVENTION

It is a general object of the present invention to provide an IC element testing device in which the above disadvantage is eliminated.

A more specific object of the present invention is to provide an IC element testing device capable of varying a voltage, to be applied to an IC element to be tested, in a very short time.

The above objects of the present invention are achieved by an IC element testing device comprising:

test pattern generating means for generating test patterns;

power supply means for generating a power supply voltage;

superposed voltage generating unit for generating a superposed voltage; and superposing means for superposing the superposed voltage on the power supply voltage and for outputting a superposed power supply voltage to an IC element to which the test patterns generated by the test pattern generating means are applied.

BRIEF DESCRIPTION OF THE DRAWINGS

Other objects, features and advantages of the present invention will become more apparent from the following detailed description when read in conjunction with the accompanying drawings, in which:

FIG. 1B is a waveform diagram of the operation of the conventional IC element testing device shown in FIG. 1A;

FIG. 3B is a waveform diagram of the operation of the IC element testing device shown in FIG. 3A;

DESCRIPTION OF THE PREFERRED EMBODIMENTS

Figure 1A:
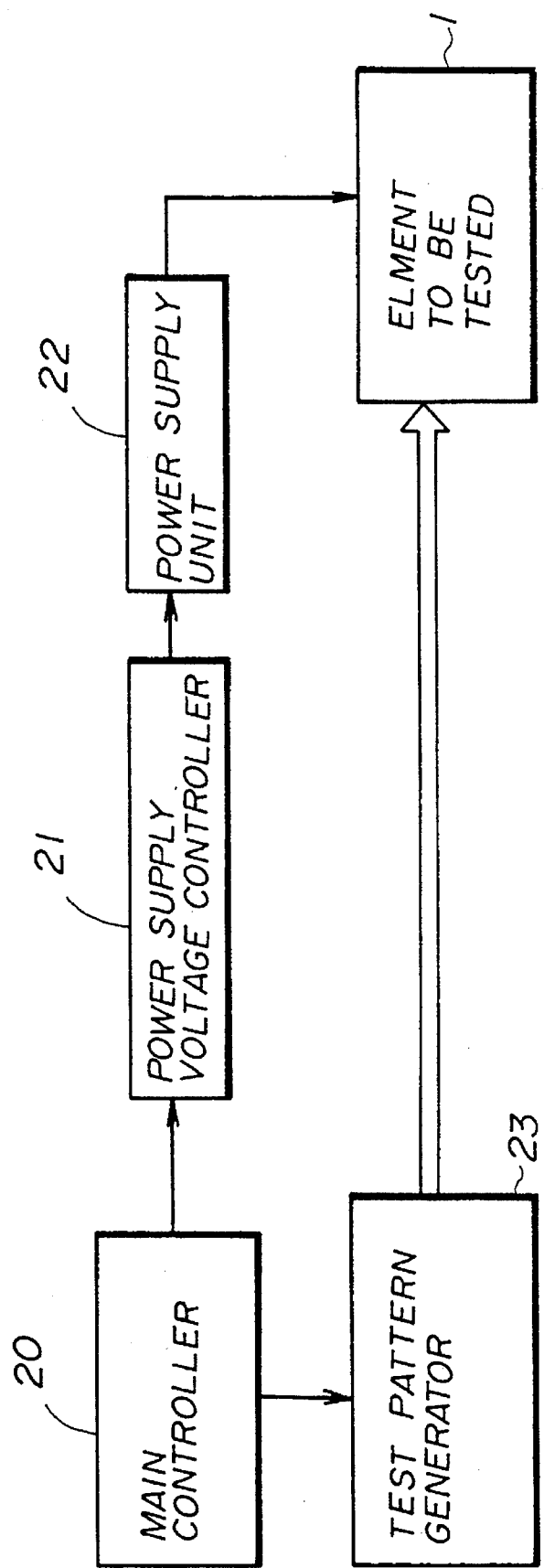
FIG. 1A is a block diagram of a conventional IC element testing device.
Figure 2:
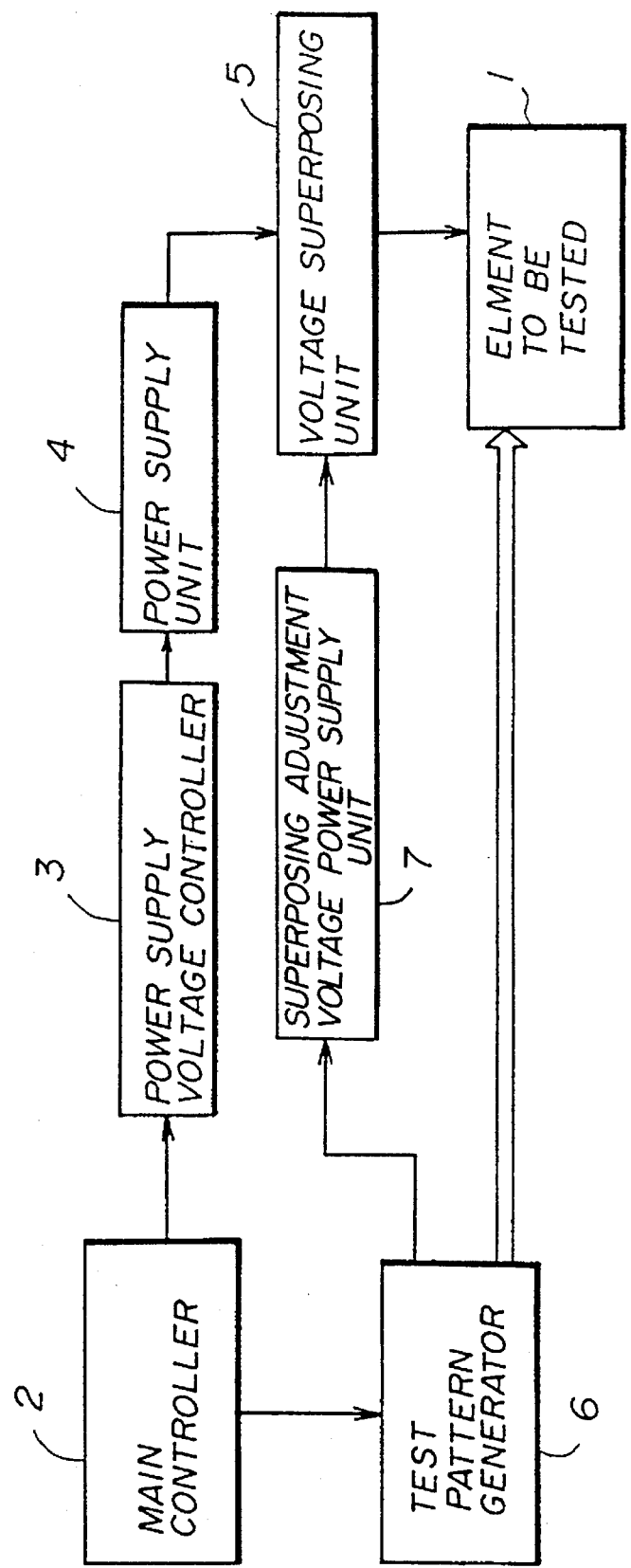
FIG. 2 is a basic block diagram of the device of the present invention.

FIG. 2 is a basic block diagram for explaining the principle of the present invention. The IC element testing device shown in FIG. 2 includes a main controller 2, a power supply voltage controller 3, a power supply unit 4, a voltage superposing unit 5, a test pattern generator 6 and a superposed power supply unit (also referred to as a superposed adjustment voltage generating unit) 7. A voltage output from the voltage superposing unit 5 is applied to an IC element 1 to be tested.

When the IC element 1 is tested, the main controller 2 outputs a control instruction to the power supply voltage controller 3 so that the power supply voltage Vcc generated by the power supply unit is equal to 5V. In response to the control instruction, the power supply voltage controller 3 turns ON the power supply unit 4, which generates a power supply voltage of 5V (= Vcc). At this time, the output voltage of the superposed adjustment voltage power supply unit 7 is zero. Hence, the DC power supply voltage output of the power supply unit 4 is not controlled at all and is applied to the IC element 1 without modification.

The main controller 2 outputs a first test pattern starting instruction to the test pattern generator 6, which sends a first test pattern to the IC element 1. In this state, the IC element 1 is tested in the normal state in which the normal power supply voltage (Vcc =5V) is applied thereto.

When the bump test is performed, the main controller 2 outputs a bump test starting signal to the test pattern generator 6. In response to the above starting signal, the test pattern generator 6 causes the superposed power supply unit 7 to control the voltage superposing unit 5 to reduce the output voltage of the power supply voltage 4 to an adjusted power supply voltage suitable for the bump test. Hence, the output voltage of the power supply unit 4 as received and is decreased to a voltage level suitable for the bump test in a very short time by the voltage superposing unit 5. Then, the test pattern generator 6 sends a second test pattern to the IC element 1. In this state, the bump test is performed. Since the voltage suitable for the bump test can be generated in a very short time, an instantaneous fault can be correctly detected. It will be noted that the power supply unit 4 is not controlled in order to obtain the adjusted power supply voltage suitable for the bump test.

Figure 3A:
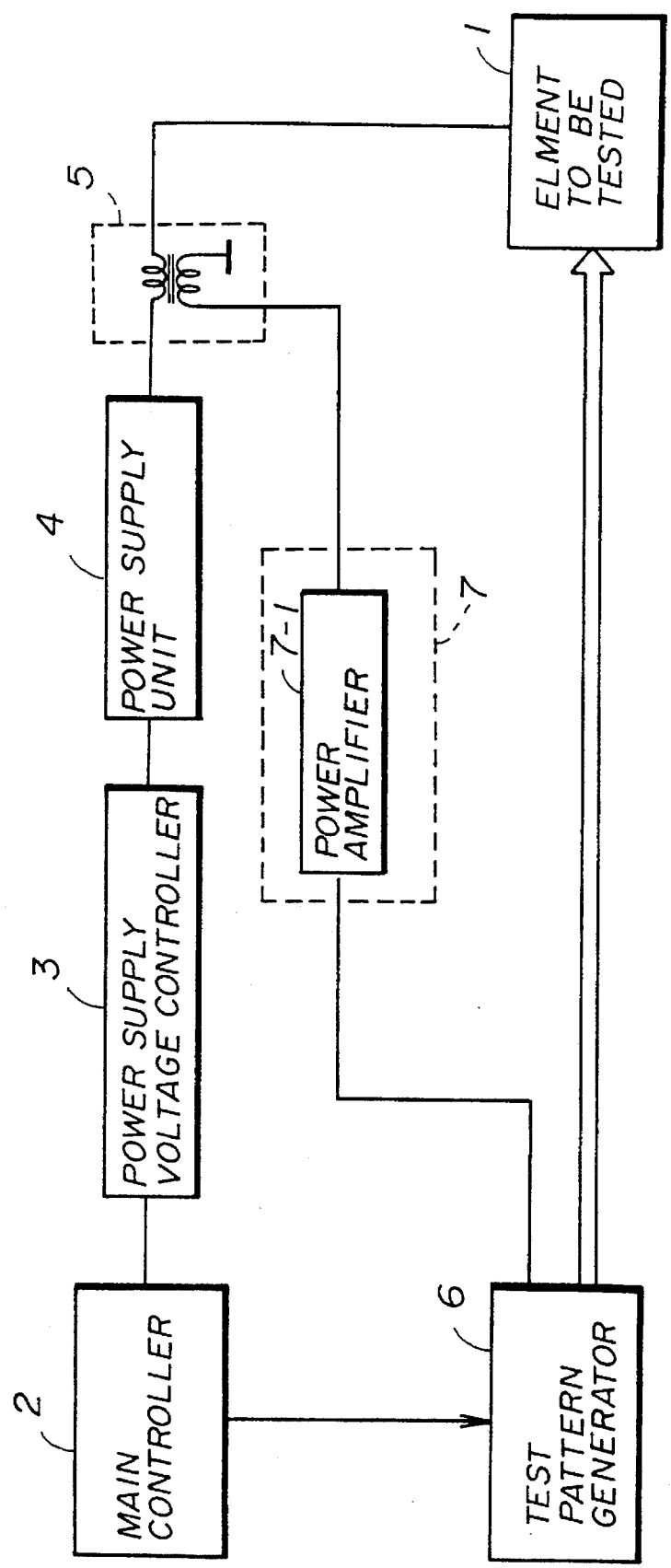
FIG. 3A is a block diagram of an IC element testing device according to a first embodiment of the present invention.

FIG. 3A is a block diagram of an IC element testing device according to a first embodiment of the present invention. In FIG. 3A, parts that are the same as those shown in FIG. 2 are given the same reference numbers as previously. The IC element 1 subjected to the bump test is, for example, an IC memory element or chip. The main controller 2 performs the overall control of the testing device, and comprises a CPU (Central Processing Unit) or the like. The power supply voltage controller 3 receives the control instruction from the main controller 2, and controls the power supply unit 4.

The power supply unit 4 generates a DC voltage, applied to the IC element 1, equal to, for example, 5V. The power supply unit 4 has a built-in variable resistor (not shown) for adjusting the output voltage. When the variable resistor is adjusted so as to generate the DC voltage 5V, it takes a long time for the DC voltage to shift from the current voltage value and become equal to 5V.

The voltage superposing unit 5 superposes the adjustment voltage generated by the superposed adjustment voltage power supply unit 7 on the DC voltage generated by the power supply unit 4, so that the DC voltage output of unit 4 is reduced to the DC voltage suitable for the bump test, for example, 4.5V, as output by unit 5. When no voltage is output by the superposed adjustment voltage power supply unit 7, the voltage superposing unit 5 outputs the DC voltage from the power supply unit 4 without modification. The voltage superposing unit 5 comprises a transformer having a primary winding connected to the power supply unit 4 and a secondary winding connected to the superposed power supply unit 7.

The test pattern generator 6 generates test patterns based on the contents of the instruction from the main controller 2. When the bump test is performed, the test pattern generator 6 outputs a trigger signal Tg to the superposed adjustment voltage power supply unit 7 after the first test pattern is output, and generates the second test pattern. The trigger signal Tg can be generated by the main controller 2. The second test pattern may be identical to or different from the first test pattern. The superposed adjustment voltage power supply unit 7 comprises a power amplifier 7-1. When the superposed adjustment voltage power supply unit 7 receives the trigger signal Tg from the test pattern generator 6, the unit 7 generates a rectangular-pulse signal having a predetermined pulse duration and having a predetermined voltage level.

A description will now be given of the operation of the first embodiment of the present invention. When the IC element 1 is tested by the testing device, the main controller 2 outputs the control instruction to the power supply voltage controller 3 so that the power supply unit 4 is turned ON and the output voltage Vcc =5 is applied to the IC element 1 to be tested. The output voltage is applied to the IC element 1 via the primary winding of the transformer of the voltage superposing unit 5. After the time necessary for the output voltage to settle has elapsed, the main controller 2 outputs the first test pattern starting signal to the test pattern generator 6.

The test pattern generator 6 outputs the first test pattern to the IC element 1, which is tested in the normal voltage state. After the first test pattern is completed, the test pattern generator 6 outputs the trigger signal Tg to the power amplifier 7-1 of the superposed adjustment voltage power supply unit 7. The power amplifier 7-1 outputs the adjustment voltage comprising a rectangular-pulse signal, having the predetermined level during the predetermined period, to the secondary winding of the transformer of the voltage superposing unit 5.

As shown in FIG. 3B, when the voltage continuously applied to the IC element 1 during the period T3 is reduced to 4.5V, the test pattern generator 6 outputs the second pattern, used for the bump test, to the IC element 1. In order to repeatedly perform the bump test, the trigger signal Tg is repeatedly applied to the power amplifier 7-1 in constant cycles. Each time the trigger signal Tg is applied to the power amplifier 7-1, the DC voltage applied to the IC element 1 can be reduced. The period T3 is, for example, a few microseconds.

In the above-mentioned manner, the trigger signal Tg is output by the test pattern generator 6, which enables the voltage applied to the IC element 1 to be reduced in a very short time, so that the bump test can be effectively and efficiently performed.

Figure 4:
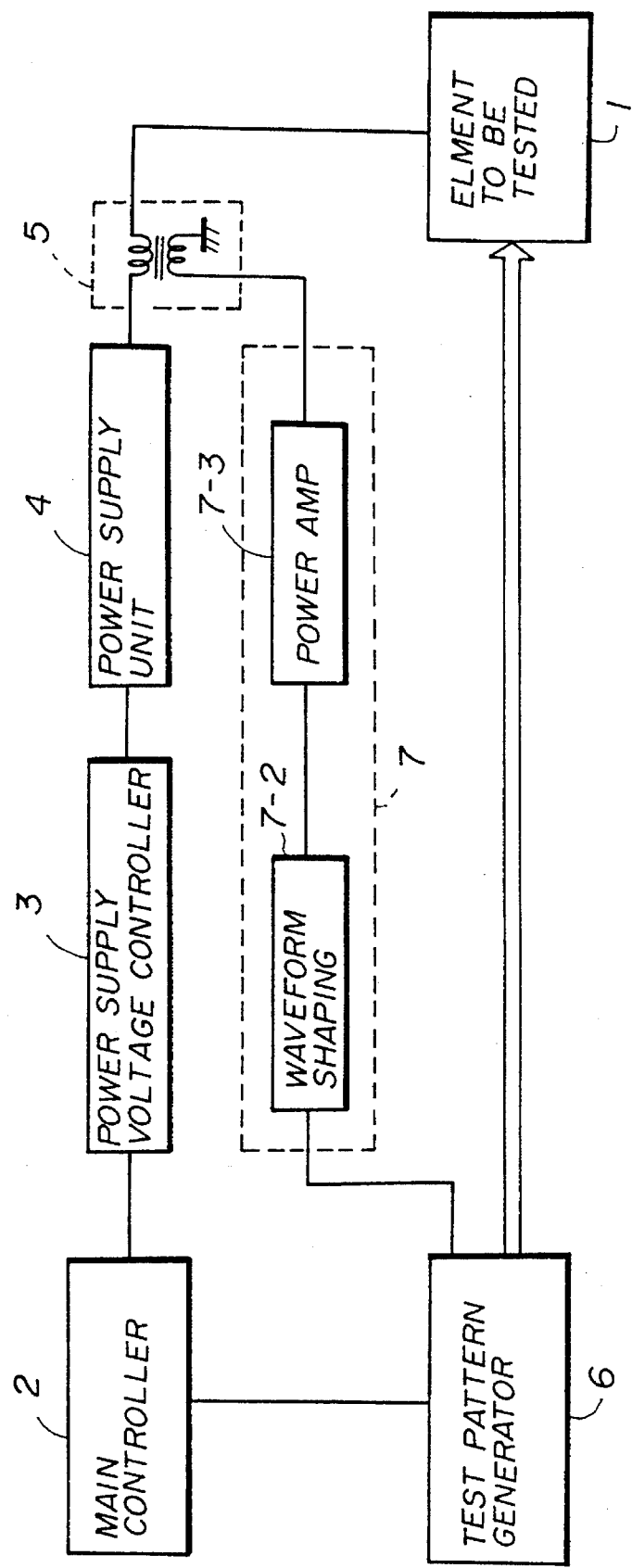
FIG. 4 is a basic block diagram of an IC element testing device according to a second embodiment of the present invention.

FIG. 4 is a block diagram of a second embodiment of the present invention. In FIG. 4, parts that are the same as those shown in the previously described figures are given the same reference numbers. The superposed adjustment voltage power supply unit 7 shown in FIG. 4 comprises a waveform shaping unit 7-2 and a power amplifier 7-3. The waveform shaping unit 7-2 shapes the waveform of the trigger signal Tg, generated by the test pattern generator 6, into a signal waveform which arbitrarily varies the period during which the voltage level is changed or the voltage level set during the above period. The waveform-shaped signal is amplified by the power amplifier 7-3, and the amplified signal is applied to the voltage superposing unit 5. In the above manner, the period during which the voltage level is changed or the voltage level which is set during the above period can be arbitrarily changed. Hence, an efficient and effective bump test can be performed.

Figure 5:
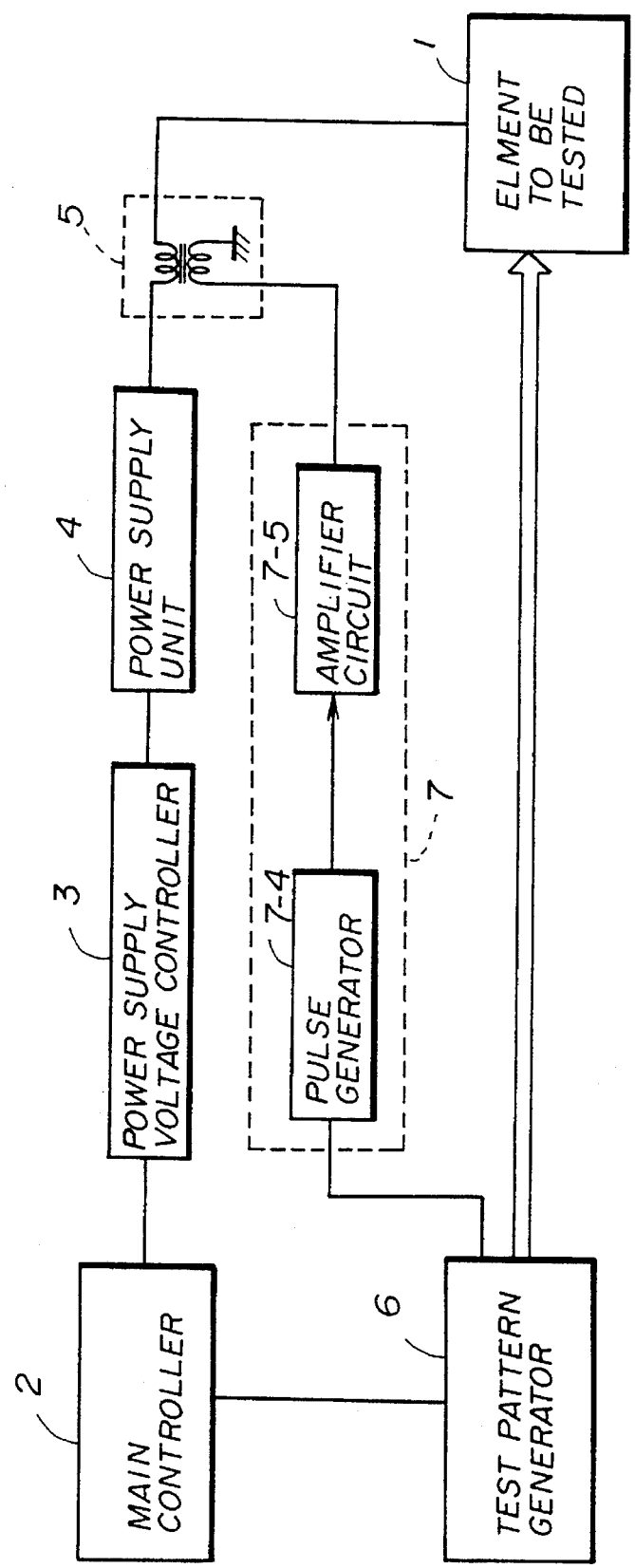
FIG. 5 is a basic block diagram of an IC element testing device according to a third embodiment of the present invention.

FIG. 5 is a block diagram of a third embodiment of the present invention. In FIG. 5, parts that are the same as those shown in the previously described figures are given the same reference numbers as previously. The superposed adjustment voltage power supply unit 7 is made up of a pulse generator 7-4 and an amplifier circuit 7-5. The pulse generator 7-4 generates, based on the trigger signal Tg supplied from the test pattern generator 6, a pulse signal having an adjusted voltage at an adjusted timing. The pulse signal generated by the pulse generator 7-4 is amplified by the amplifier circuit 7-5, and the amplified pulse signal is applied to the voltage superposing unit 5. In the above-mentioned manner, it is possible to suitably adjust the voltage applying period and the voltage level applied during the above period, so that a bump test can be effectively and efficiently performed.

Figure 6:
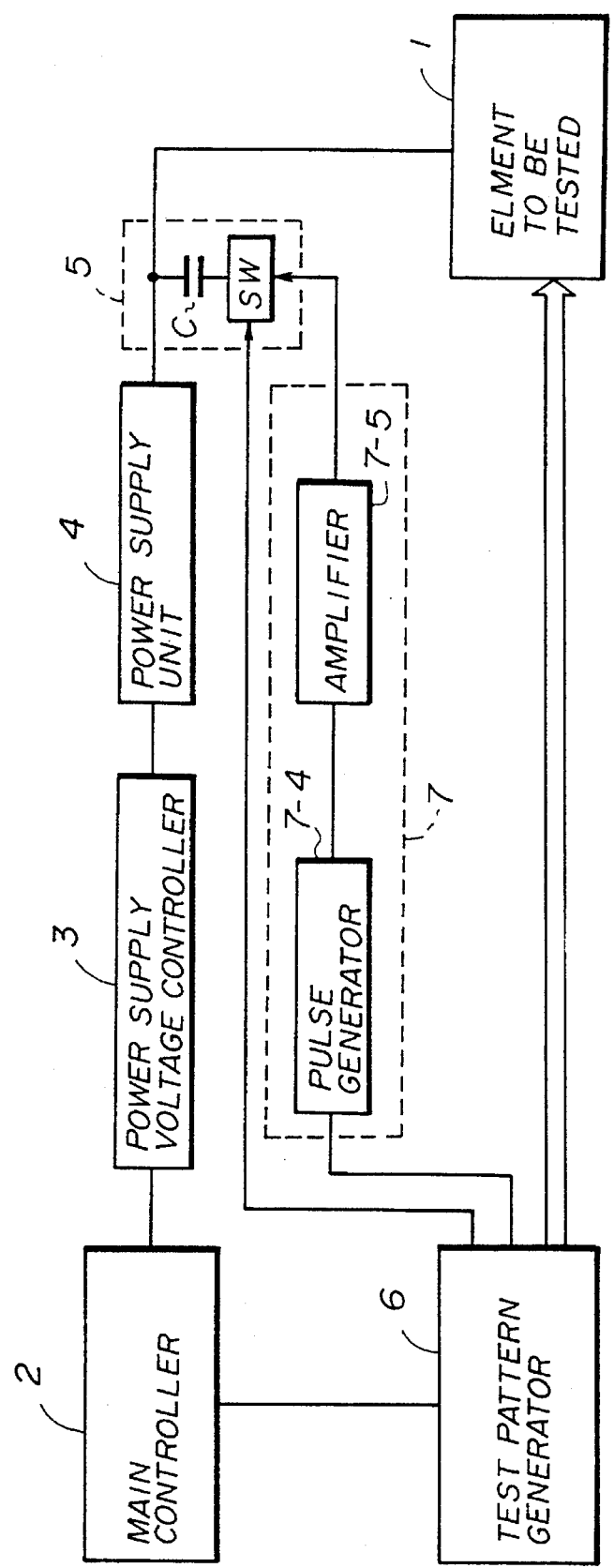
FIG. 6 is a basic block diagram of an IC element testing device according to a fourth embodiment of the present invention.

FIG. 6 is a block diagram of a fourth embodiment of the present invention. In FIG. 6, parts that are the same as those shown in the previously described figures are given the same reference numbers as previously. The superposed adjustment voltage power supply unit 7 comprises the pulse generator 7-4 and the amplifier circuit 7-5. The voltage superposing unit 5 includes a capacitor C and a switch SW. The test pattern generator 6 turns ON the switch SW, through which the output signal of the superposed adjustment voltage power supply unit 7 is superposed on the output voltage of the power supply unit 4. The switch SW can be omitted. By utilizing the capacitive coupling of the capacitor C, it is possible to perform the bump test for the IC element 1.

In the above-mentioned embodiments of the present invention, the voltage applied to the IC element at the time of performing the bump test is 4.5V. However, the voltage used for the bump test is not limited to 4.5V and another appropriate voltage (for example, 4.75V) can be used.

The present invention is not limited to the specifically disclosed embodiments, and variations and modifications may be made without departing from the scope of the present invention.

What is claimed is:

1. An IC element testing device for testing an IC element, comprising:
   test pattern generating means for generating test patterns;
   power supply means for generating a power supply voltage;
   a superposed adjustment voltage generating unit for generating a superposed adjustment voltage in synchronism with the test patterns; and
   superposing means for superposing the superposed adjustment voltage on the power supply voltage and for outputting an adjusted power supply voltage to an IC element to which the test patterns, generated by the test pattern generating means, are applied.

2. The IC element testing device as claimed in claim 1, further comprising:
   means for generating a trigger signal; and
   the superposed adjustment voltage generating means generates the superposed adjustment voltage in response to said trigger signal.

3. The IC element testing device as claimed in claim 1, wherein the superposed adjustment voltage generating means further comprises means for varying the superposed adjustment voltage.

4. The IC element testing device as claimed in claim 1, wherein the superposed adjustment voltage generating means further comprises means for generating the superposed adjustment voltage during a variable period.

5. The IC element testing device as claimed in claim 1, wherein the superposed adjustment voltage generating means further comprises means for varying a variable superposed adjustment voltage during a variable period.

6. The IC element testing device as claimed in claim 1, wherein the superposing means further comprises a transformer having a primary winding connected to the power supply means and a secondary winding connected to the superposed voltage generating means.

7. The IC element testing device as claimed in claim 2, wherein the superposed adjustment voltage generating means further comprises an amplifier which amplifies the trigger signal.

8. The IC element testing device as claimed in claim 2, wherein the superposed adjustment voltage generating means further comprises:
   a waveform shaping unit which shapes the trigger signal into a predetermined waveform; and
   an amplifier which amplifies a signal having said predetermined waveform, said signal having said predetermined waveform corresponding to the superposed adjustment voltage.

9. The IC element testing device as claimed in claim 2, wherein the superposed adjustment voltage generating means further comprises:
   a pulse generator which generates a pulse signal in response to the trigger signal; and
   an amplifier which amplifies said pulse signal, said pulse signal corresponding to the superposed adjustment voltage.

10. The IC element testing device as claimed in claim 1, wherein the superposing means further comprises a capacitor via which the superposed adjustment voltage is superposed on the power supply voltage.

11. The IC element testing device as claimed in claim 2, wherein the superposing means further comprises;
   a capacitor; and
   a switch which selectively connects the superposed adjustment voltage generating means to the IC element via the capacitor.

12. A device for testing an IC element at each of power supply voltages of first and second, different voltage levels applied to the IC element for rendering same operative, comprising:
   a power supply unit generating a first power supply voltage of the first voltage level;
   an adjustment voltage generating unit which generates an adjustment voltage which, when superposed on the power supply voltage, yields an adjusted power supply voltage of the second voltage level;
   a superpositioning circuit which superposes the adjustment voltage on the power supply voltage and outputs, and supplies to the IC element, the adjusted power supply voltage of the second voltage level; and
   a test pattern generator which selectively generates a test pattern synchronized with each of the first and second power supply voltages.

* * * * *